(12) United States Patent
Lueng et al.

(10) Patent No.: US 9,121,888 B2
(45) Date of Patent: *Sep. 1, 2015

(54) METHOD OF TESTING ANTI-HIGH TEMPERATURE PERFORMANCE OF A MAGNETIC HEAD AND APPARATUS THEREOF

(75) Inventors: Chiuming Lueng, Hong Kong (CN); Cheukman Lui, Hong Kong (CN); Mankit Lee, Hong Kong (CN); Hokei Lam, Hong Kong (CN); Kwokkam Leung, Hong Kong (CN); Cheukwing Leung, Hong Kong (CN); Juren Ding, Hong Kong (CN); Rongkwang Ni, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 227 days.

This patent is subject to a terminal disclaimer.

(21) Appl. No.: 13/064,994

(22) Filed: Apr. 29, 2011

(65) Prior Publication Data

US 2012/0274317 A1 Nov. 1, 2012

(51) Int. Cl.
*G01R 33/12* (2006.01)
*G11B 5/455* (2006.01)
*B82Y 25/00* (2011.01)
*G11B 27/36* (2006.01)

(52) U.S. Cl.
CPC ............ *G01R 33/1207* (2013.01); *G01R 33/12* (2013.01); *B82Y 25/00* (2013.01); *G11B 5/455* (2013.01); *G11B 5/4555* (2013.01); *G11B 27/36* (2013.01)

(58) Field of Classification Search
CPC ...... G11B 5/455; G11B 27/36; G11B 5/4555; G01R 33/1207; G01R 33/12; B82Y 25/00
USPC .................................................. 324/210, 201
See application file for complete search history.

(56) References Cited

U.S. PATENT DOCUMENTS

| | | | | |
|---|---|---|---|---|
| 5,227,212 A | * | 7/1993 | Ahlert et al. | 360/99.18 |
| 6,178,054 B1 | * | 1/2001 | Wakefield | 360/31 |
| 6,181,493 B1 | * | 1/2001 | Wakefield | 360/31 |
| 6,943,545 B2 | * | 9/2005 | Patland et al. | 324/210 |
| 7,538,546 B2 | * | 5/2009 | Patland et al. | 324/210 |
| 7,683,610 B2 | * | 3/2010 | Shimazawa | 324/210 |
| 7,960,968 B2 | * | 6/2011 | Kiyono et al. | 324/210 |
| 2008/0049351 A1 | | 2/2008 | Yamanaka et al. | |
| 2009/0128941 A1 | * | 5/2009 | Taratorin | 360/31 |
| 2009/0147389 A1 | * | 6/2009 | Taratorin et al. | 360/31 |
| 2009/0261228 A1 | * | 10/2009 | Merrow | 248/550 |

* cited by examiner

*Primary Examiner* — Jermele M Hollington
*Assistant Examiner* — Christopher McAndrew
(74) *Attorney, Agent, or Firm* — Nixon & Vanderhye PC

(57) ABSTRACT

A method of testing anti-high temperature performance of a magnetic head comprises applying a second magnetic field with different intensities in a second direction and the changing first magnetic fields in a first direction, and measuring a plurality of second output parameter curves; and judging whether a variation that is beyond an allowable value is presented on the second output parameter curves, thereby screening out a defective magnetic head, therein the first direction is perpendicular to the air bearing surface of the magnetic head, and the second direction is perpendicular to the shielding layers of the magnetic head. The present invention can screen out defective magnetic heads that possess poor anti-high temperature performance without heating the magnetic head and with high precision.

32 Claims, 10 Drawing Sheets

METHOD OF TESTING ANTI-HIGH TEMPERATURE PERFORMANCE OF A MAGNETIC HEAD AND APPARATUS THEREOF

FIELD OF THE INVENTION

The present invention relates to a method of testing the performance of a magnetic head and, more particularly to a method of testing the anti-high temperature performance of a magnetic head. Moreover, the present invention relates to an apparatus for testing the performance of a magnetic head, and an apparatus for testing the anti-high temperature performance of a magnetic head particularly.

BACKGROUND OF THE INVENTION

Hard disk drive incorporating rotating magnetic disks is commonly used for storing data in the magnetic media formed on the disk surfaces, and a movable head are generally used to read data from and write date into tracks on the disk surfaces.

Nowadays, the magnetoresistive (MR) read heads are widely used in a popular magnetic head because a MR element with higher sensitivity is included therein. A plurality of performance of a magnetic head must be tested before the magnetic head is used, which includes anti-high temperature performance, dynamic flying height (DFH) performance, Signal-to-Noise Ratio (SNR) performance, reliability, stability and the like. For example, a magnetic head with a bad anti-high temperature performance will represent a lot of noise if used under a high temperature condition. And a magnetic head having a bad SNR performance will damage the reading stability of the magnetic head and affect the reading performance finally. Thus, the testing of the performance of the magnetic head is quite important and necessary.

The following method has been used as a conventional method of testing a MR read head. As shown in FIG. 1, the MR read head 10 includes two hard magnets 112, a MR element 114 sandwiched between the two hard magnets 112, and two shielding layers 116 disposed on both sides of the MR element 114 and the hard magnets 112. As known, the resistance of the MR element varies with the changes of an external magnetic field, which results in variation in the output of the MR read head. Thus an operation that applies a magnetic field in a direction 19 that is parallel to the shielding layers 116 and at 0° angle to the air bearing surface 117 (ABS) of the MR read head 10 (hereinafter this is referred to as "common magnetization direction") and measures the output voltage of the MR read 10 head is repeatedly carried out. And the difference between the highest and lowest output voltage is calculated as the variation and used to evaluate whether the output variation is within a certain allowable value. Therefore, the tested magnetic head will be rejected as a defective magnetic head if the output variation is beyond the allowable value.

The above-mentioned method utilizing the common magnetization direction is widely used in the testing of DFH performance, SNR performance, the reliability and the stability of the magnetic head. However, the testing by using the common magnetization is limited since the performance requirement of the magnetic head become higher and higher. Thus, the testing method is limited to a degree. With regard to the anti-high temperature testing, there is little sensitivity responding to the magnetization with the common magnetization direction, however. Thus, methods of testing the anti-high temperature for the magnetic head are still under development.

US patent publication No. 20080049351 A1 discloses a testing method of the anti-high temperature for the magnetic head. As shown in FIG. 2, a heating element 35 is provided on an element formation surface 2101 of the magnetic heads 21, so as to applying heat and stress to the MR element 32 of the magnetic head 21. Concretely, the heating element 35 generates heat when electric current is passed through it. A large internal stress is generated in the MR element 32 due to the thermal expansion of the MR element 32 caused by heat generated by the heating element 35 and the thermal expansion of the material surrounding the MR element 32, in addition to internal distortion inherent in the MR element 32. The level of noise that occurs in an output of the MR element 32 is measured under these conditions to identify whether or not the magnetic head 21 has a potential distortion that can cause noise under high-temperature conditions.

However, since the magnetic head is tested under a plurality of changing high-temperature conditions repeatedly, thus the selection and controlling of the sample temperature need to be precise. If the temperature is too high, there is a potential of damaging the non-defective magnetic head during the testing.

Moreover, this method mentioned above is only suitable for the magnetic head with a heating element equipped therein. The anti-high temperature testing is incapable of being performed in the case that the heating element is failed to be equipped in the magnetic head.

Hence, it is desired to provide an improved method of testing anti-high temperature performance of a magnetic head, and a method of testing the performance of a magnetic head to overcome the above-mentioned drawbacks.

SUMMARY OF THE INVENTION

One objective of the present invention is to provide a method of testing anti-high temperature performance of a magnetic head, which can screen out defective magnetic heads that possess poor anti-high temperature performance without heating the magnetic head.

Another objective of the present invention is to provide a method of testing the performance of a magnetic head, which can test defective magnetic head that could not be completely detected by a conventional testing method that uses common magnetization.

Yet another objective of the present invention is to provide an apparatus for testing anti-high temperature performance of a magnetic head, which can screen out defective magnetic heads that possess poor anti-high temperature performance without heating the magnetic head.

Still a further objective of the present invention is to provide an apparatus for testing the performance of a magnetic head, which can test defective magnetic head that could no be completely detected by a conventional testing method that uses common magnetization.

To achieve the above objectives, a method of testing anti-high temperature performance of a magnetic head, the magnetic head includes two shielding layers and an air bearing surface, and the method comprises applying a plurality of first magnetic fields with different intensities in a first direction to the magnetic head, and measuring a first output parameter curve; repeating to apply a second magnetic field with different intensities in a second direction and the changing first magnetic fields in the first direction, and measuring a plurality of second output parameter curves; and judging whether a variation that is beyond an allowable value is presented on the first output parameter curve and the second output parameter curves, thereby screening out a defective magnetic head. Therein the first direction is perpendicular to the air bearing surface of the magnetic head, and the second direction is perpendicular to the shielding layers of the magnetic head.

As a preferred embodiment, the method further comprises applying a third magnetic field with a third direction to the magnetic head, and the third direction is parallel to the shielding layers and at 0° angle to the air bearing surface.

Preferably, the first direction goes in the air bearing surface or goes out from the air bearing surface.

Preferably, the shielding layers comprise a first shielding layer and a second shielding layer, the second direction flows from the first shielding layer to the second shielding layer, or flows from the second shielding layer to the first shielding layer.

As another preferred embodiment, the intensity of the first magnetic field and the second magnetic field is in a range of −800 Oe~800 Oe.

Preferably, the intensity of the second magnetic fields includes several pairs of numerical values that have the same absolute value.

Preferably, the first and the second output parameter curves are represented by output voltage.

Alternatively, the first and the second output parameter curves are represented by signal-to-noise ratio.

Preferably, the variation has a maximum jumping having a jumping ratio, and the jumping ratio of the allowable value is 8%.

A method of testing the performance of a magnetic head, the magnetic head includes two shielding layers and an air bearing surface, and the method comprises applying a second magnetic filed in a second direction that is perpendicular to the shielding layers to the magnetic head, and measuring an output parameter of the magnetic head; and repeating the applying of the second magnetic fields with different intensities and the measuring for a plurality of times, so as to test the performance of the magnetic head.

As a preferred embodiment, the method further comprises applying a first magnetic field in a first direction that is perpendicular to the air bearing surface to the magnetic head.

As another preferred embodiment, the method further comprises applying a third magnetic field in a third direction to the magnetic head, and the third direction is parallel to the shielding layers and at 0° angle to the air bearing surface.

Preferably, the first direction goes in the air bearing surface or goes out from the air bearing surface.

Preferably, the shielding layers comprise a first shielding layer and a second shielding layer, the second direction flows from the first shielding layer to the second shielding layer, or flows from the second shielding layer to the first shielding layer.

Preferably, the first and the second output parameter curves are represented by output voltage.

Alternatively, the first and the second output parameter curves are represented by signal-to-noise ratio.

Accordingly, an apparatus for testing anti-high temperature performance of a magnetic head, the magnetic head includes two shielding layers and an air bearing surface, and the apparatus comprises a first magnetic field applying unit for applying a plurality of first magnetic fields with different intensities in a first direction to the magnetic head; a first measuring unit for measuring a first output parameter curve according to the first magnetic fields; a second magnetic field applying unit for repeating to apply a second magnetic field with different intensities in a second direction and the changing first magnetic fields in the first direction to the magnetic head; a second measuring unit for measuring a plurality of second output parameters; and a judging unit for judging whether a variation that is beyond an allowable value is presented on the first output parameter curve and the second output parameter curves, thereby screening out a defective magnetic head. Therein the first direction is perpendicular to the air bearing surface of the magnetic head, and the second direction is perpendicular to the shielding layers of the magnetic head.

An apparatus for testing the performance of a magnetic head, the magnetic head includes two shielding layers and an air bearing surface, and the apparatus comprises a second magnetic field applying unit for repeating to apply a second magnetic filed with different intensities in a second direction that is perpendicular to the shielding layers of the magnetic head; and a measuring unit for measuring output parameters of the magnetic head according to the second magnetic fields, so as to test the performance of the magnetic head.

In comparison with the prior art, the present invention applies a second magnetic field in a second direction that is perpendicular to the shielding layers of the magnetic field and measures out the output of the magnetic head, and repeats the magnetization operation and the measurement operation for several times, and finally screens out the defective magnetic head along the several output curves. The present invention can test out the defective magnetic heads that have a lot of noises under a high temperature condition in a room temperature, without applying additional heat to the magnetic head. Thus the testing method is improved compared with the prior art. Moreover, the present invention can screen out defective magnetic heads that could not be completely detected by a conventional testing method that uses common magnetization, and the testing precision is reliable.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
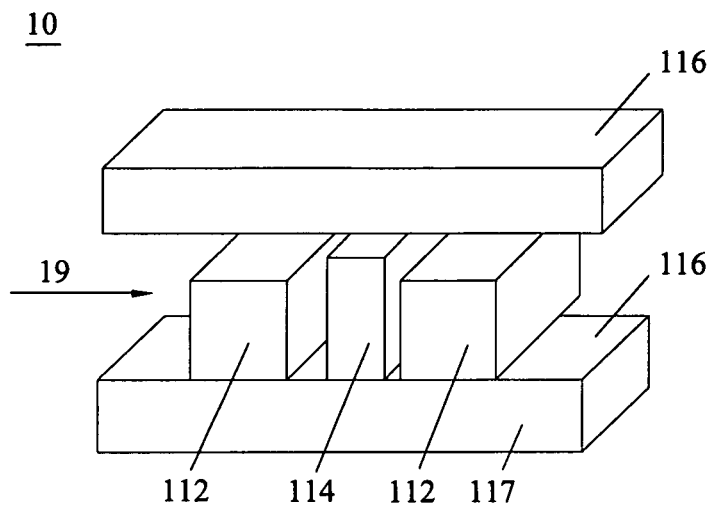
FIG. 1 is a simplified and partial perspective view of a MR read head that shows a common magnetization direction.
Figure 2:
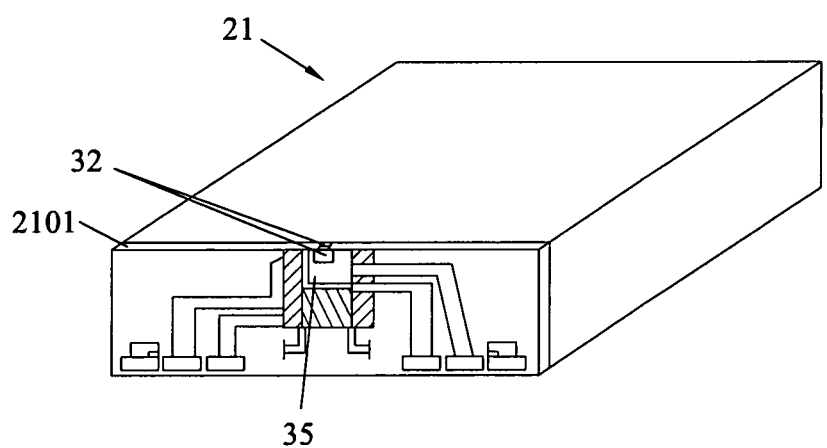
FIG. 2 is a perspective view of a magnetic head that shows a conventional testing method.

Various preferred embodiments of the invention will now be described with reference to the figures, wherein like reference numerals designate similar parts throughout the various views. As indicated above, the invention is directed to a method of testing anti-high temperature performance of a magnetic head, which applies a magnetic field in a direction perpendicular to the shielding layers of the magnetic head to the magnetic head, so as to screen out a defective magnetic head that has a bad performance if used in a high temperature condition.

The conventional magnetic head for a slider typically includes a read portion for reading data from the disk, and a write portion for writing data into the disk. The read portion is generally formed by a MR read head, such as Current Perpendicular to Plane (CPP), Current In Plane (CIP), tunnel magnetoresistive (TMR), giant magnetoresistive (GMR), or anisotropic magnetoresistive (AMR) read heads. For being understood well, the present description only concentrates on the embodiment of the CPP-TMR read head. Obviously, the persons ordinarily skilled in the art can understand the application of the present invention on the other read heads after reading the following description.

Figure 3A:
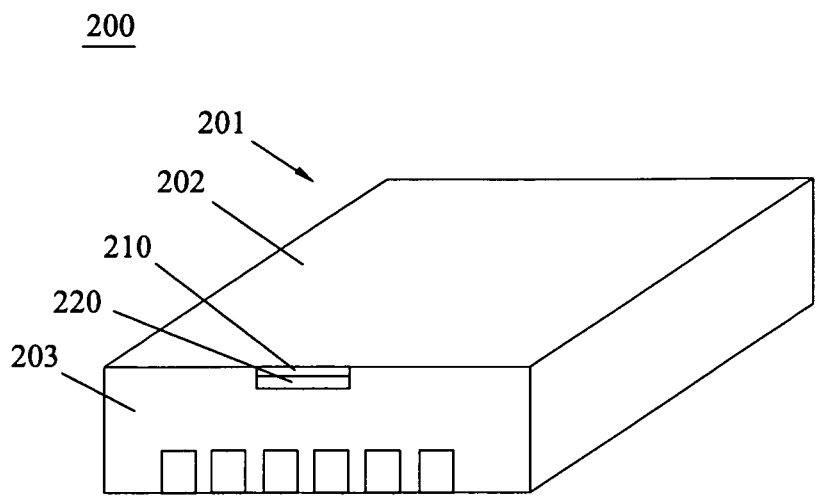
FIG. 3a is a perspective view of a magnetic head according to the present invention.
Figure 3B:
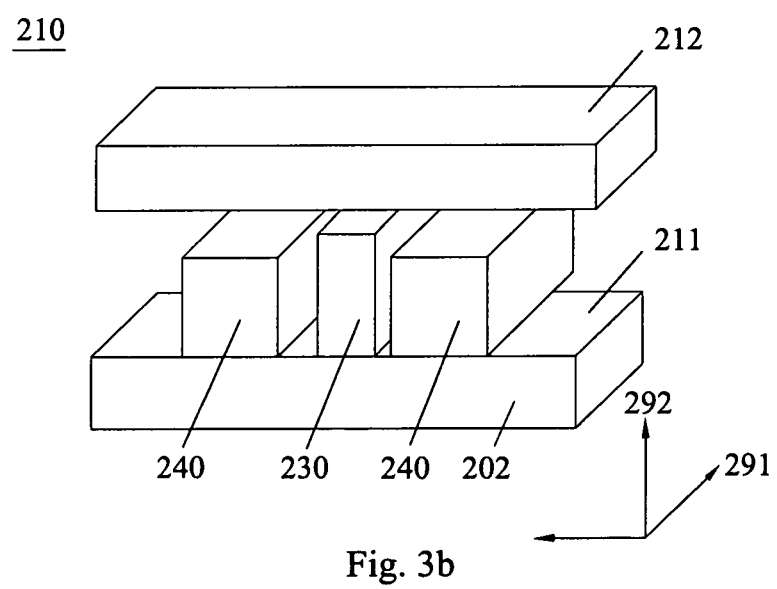
FIG. 3b is a simplified and partial perspective view of a MR read head that shows the applying of the magnetic fields with different directions according to one embodiment of the present invention.

FIG. 3a shows a magnetic head 200 which includes a substrate body 201, an ABS 202 and a bottom surface (not shown) opposite to the ABS 202, a leading edge 203 and a trailing edge (not shown) opposite each other. The ABS 202 is processed so as to an appropriate flying height. A MR read head 210 and a write head 220 are provided on the leading edge 203. Specifically, as shown in FIG. 3b, the MR read head 210 includes a first shielding layer 211 formed on a substrate (not shown), a second shielding layer 212, and a MR element 230 sandwiched between the first and second shielding layers 211, 212. Therein, a pair of hard magnet layers 240 is sandwiched therebetween as well and respectively placed on two sides of the MR element 230.

A first magnetic field with a first direction 291 can be applied to the MR read head 210, the first direction 291 is perpendicular to the ABS 202, that is, the first magnetic field traverses the ABS 202 directly and at 90 degree to the ABS 202, which the first direction 291 is called "transverse direction". Within the contemplation of the present invention, a second magnetic field with a second direction 292 can be applied to the MR read head 210, so as to testing the characteristic and the performance of the MR read head 210, which the second direction 292 is perpendicular to the shielding layers 211, 212. Particularly, in the practical example, the second direction 292 can transverse from the first shielding layer 211 to the second shielding layer 212 (hereinafter it is vividly called "outflow direction"), or transverse from the second shielding layer 222 to the first shielding layer 211 (hereinafter it is vividly called "inflow direction"), and the both of the directions are at 90 degree to the first and second shielding layers 211, 212 in like manner. As a representation, the magnetic field with the outflow direction is negative, and the magnetic field with the inflow direction is positive.

Figure 4A:
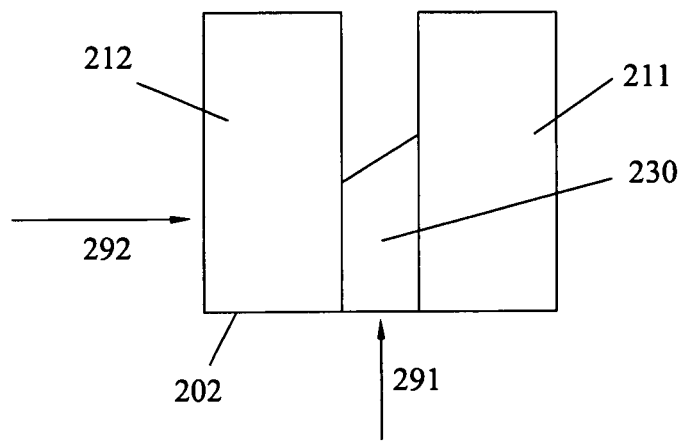
FIG. 4a is a cross-section view of the MR read head that shows the applying of the magnetic fields with a first direction and a second direction according to a first embodiment of the present invention.
Figure 4B:
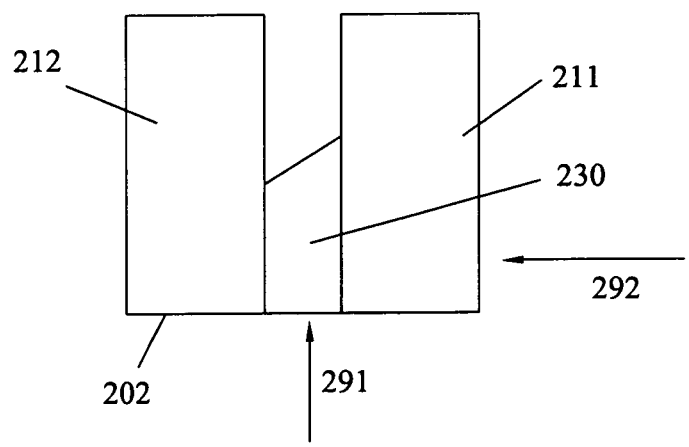
FIG. 4b is a cross-section view of the MR read head that shows the applying of the magnetic fields with a first direction and a second direction according to a second embodiment of the present invention.

For better understanding the first direction 291 and the second direction 292, FIGS. 4a and 4b respectively show a cross-section view of the MR read head 210 with applying the magnetic fields with the first direction 291 and the second direction 292 according to two embodiments of the present invention. Therein, the second direction 292 illustrated in FIG. 4a is the inflow direction, and the second direction 292 illustrated in FIG. 4b is the outflow direction.

Figure 5:
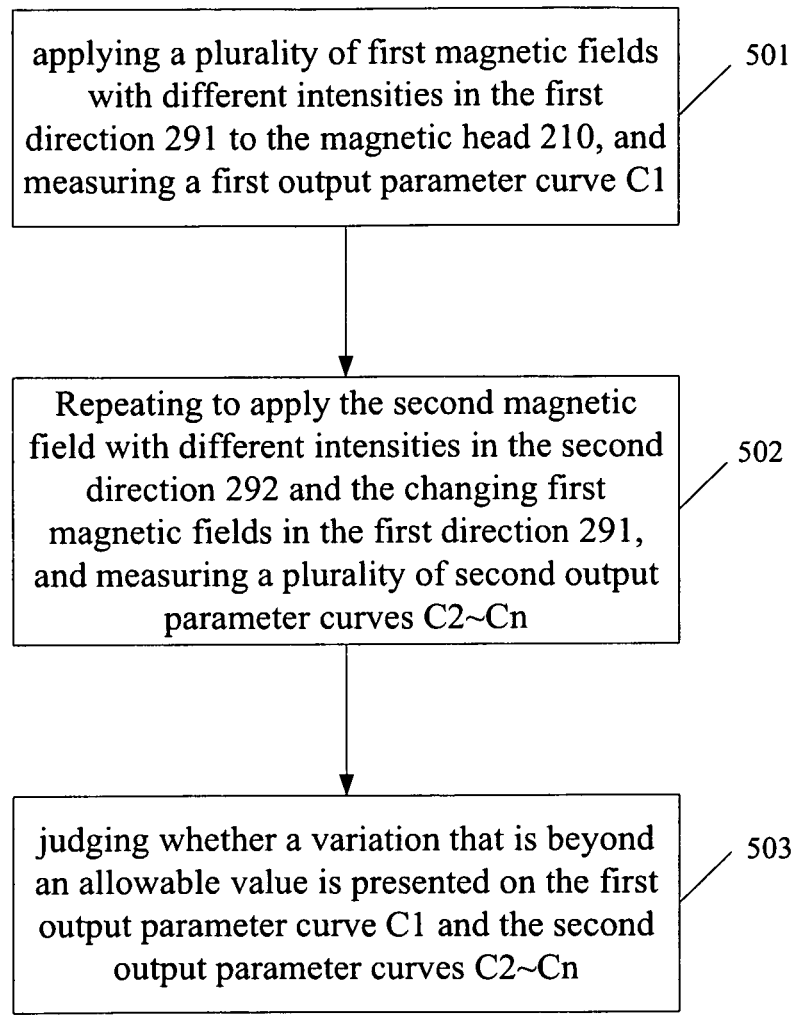
FIG. 5 is a flowchart of a method of testing anti-high temperature performance of a magnetic head according to one embodiment of the present invention.
Figure 6A:
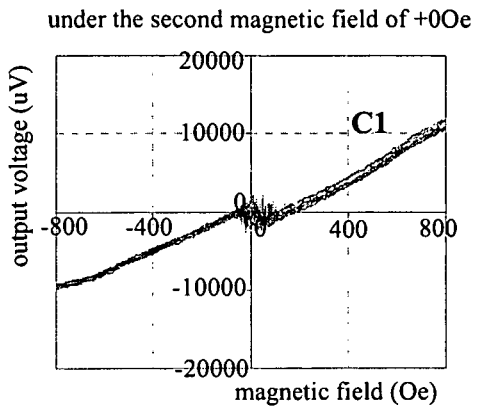
FIGS. 6a-6i show graphs of a practical example, illustrating different output voltage curves of a MR read head under the magnetic fields with different intensities.
Figure 6D:
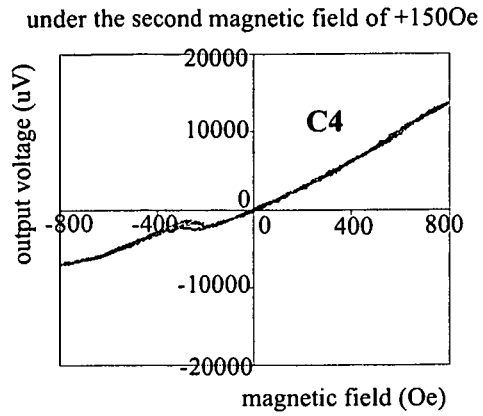
Figure 6B:
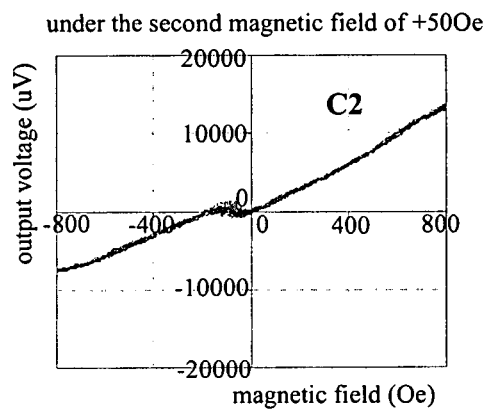
Figure 6E:
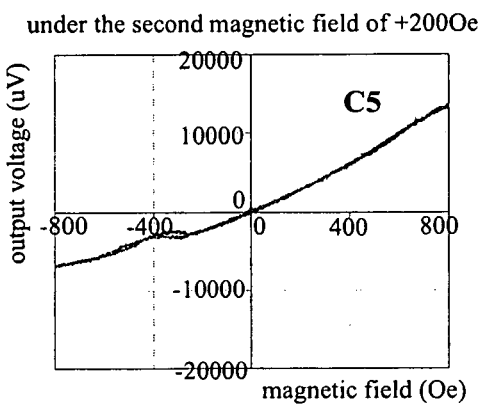
Figure 6C:
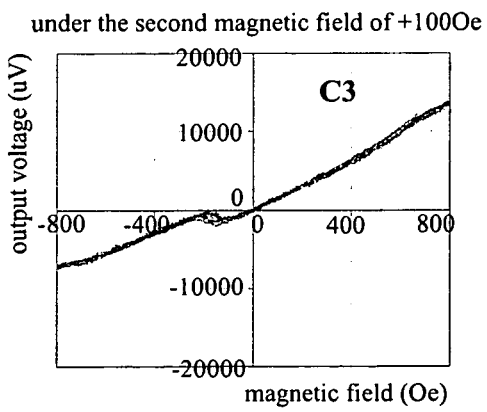
Figure 6F:
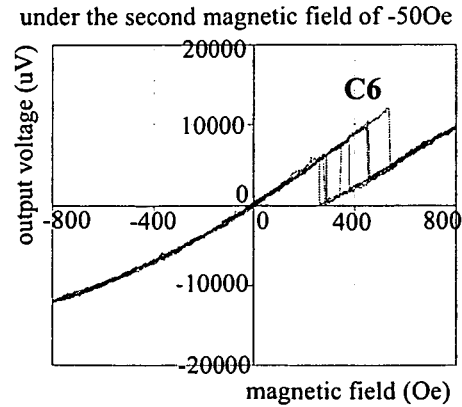
Figure 6G:
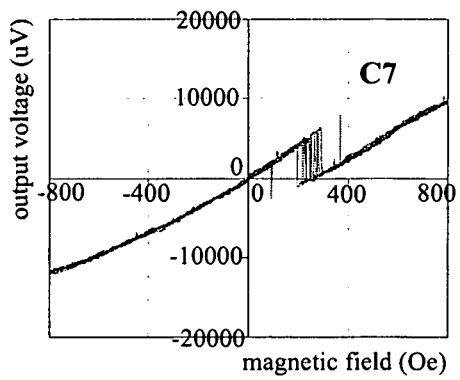
Figure 6H:
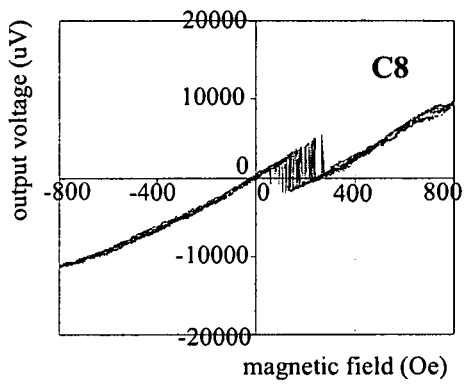
Figure 6I:
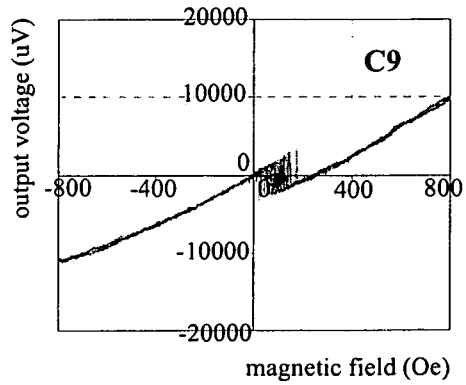
Figure 7A:
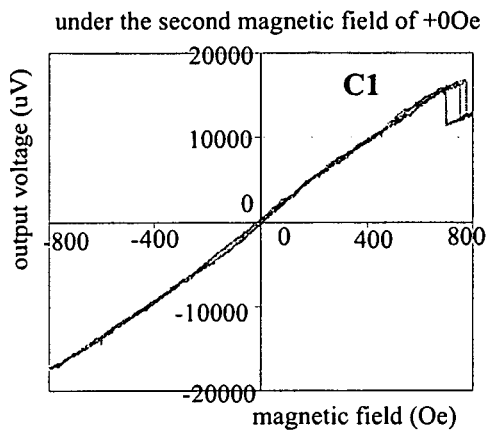
FIGS. 7a-7i show graphs of another practical example, illustrating different output voltage curves of a MR read head under the magnetic fields with different intensities.
Figure 7D:
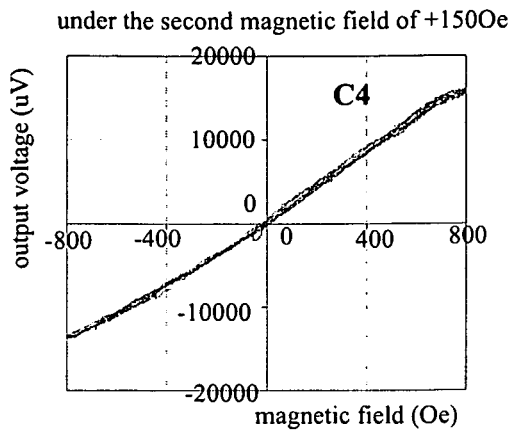
Figure 7B:
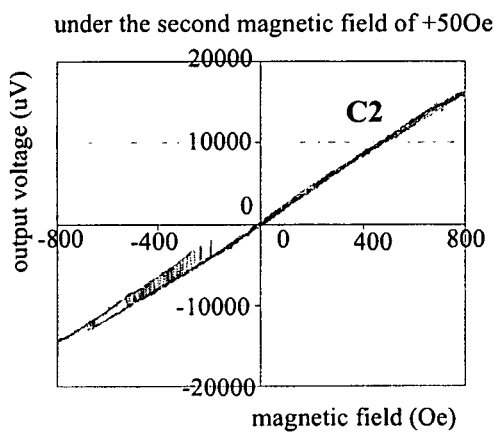
Figure 7E:
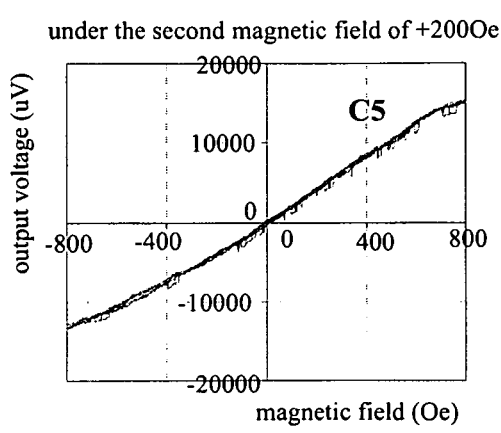
Figure 7C:
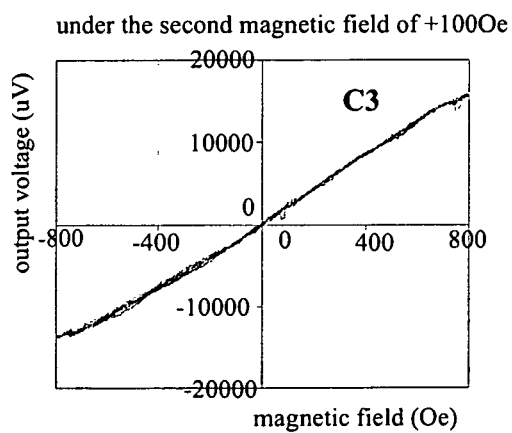
Figure 7F:
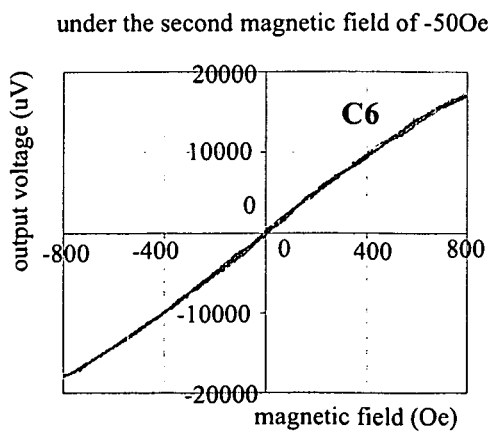
Figure 7G:
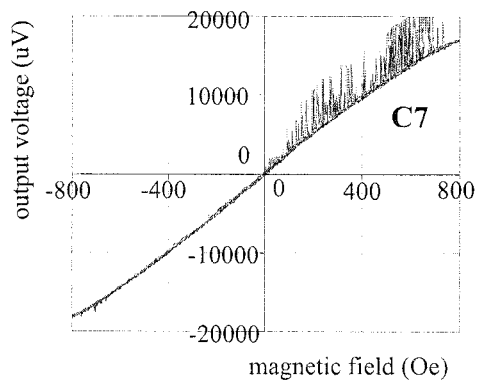
Figure 7H:
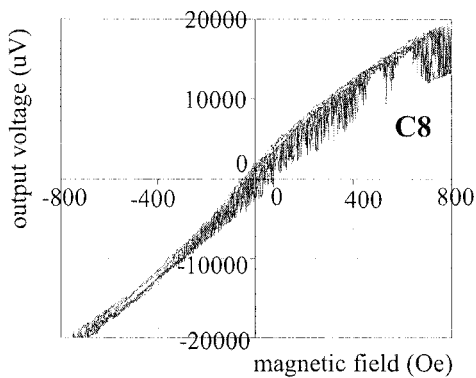
Figure 7I:
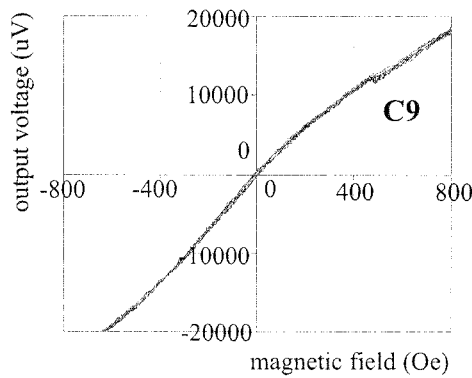

FIG. 5 is a flowchart of a method of testing anti-high temperature performance of a magnetic head according to one embodiment of the present invention, and the method includes the following steps.

Step (501), applying a plurality of first magnetic fields with different intensities in the first direction 291 to the magnetic head 210, and measuring a first output parameter curve C1;

Step (502), repeating to apply the second magnetic field with different intensities in the second direction 292 and the changing first magnetic fields in the first direction 291, and measuring a plurality of second output parameter curves C2~Cn; and Step (503), judging whether a variation that is beyond an allowable value is presented on the first output parameter curve C1 and the second output parameter curves C2~Cn, thereby screening out the defective magnetic head.

If the variation beyond the allowable value is presented on the curves, the tested magnetic head is rejected as a defective magnetic head that opposes a bad performance (a plurality of noises may appear for example) under the high temperature condition if used under the high temperature condition; otherwise is a nondefective. As a representation, the tremendous variation has a maximum jumping with a jumping ratio that is larger than 8%. In other words, if a maximum jumping with a jumping ratio is larger than 8%, the tested magnetic head is a defective magnetic head. Visually, the problematic magnetic head can be indicated by some serious shakes shown in an output curve.

Specifically, the output voltage is one of the output parameters utilized in the present embodiment, certainly other output parameters such as resistance, SNR ratio also can be used to test according to the conception of the present invention.

As regarding to the testing times and the magnetic field intensities for one magnetic head, it's dependent on the actual demand. Inventors find out that the testing result and precision is preferable when respectively applying a series of positive magnetic fields and a series of negative magnetic fields with absolute value being the same with the positive magnetic fields. The detailed explanation will be described hereinafter.

FIGS. 6a-6i shows a preferred embodiment of a method of testing anti-high temperature performance of a magnetic head according to the present invention, basing on the above-mentioned embodiment shown in FIG. 5. In the preferred embodiment, the magnetization operation and measurement of output voltage are carried out night times for the tested magnetic head. The first magnetic field has an intensity in a range of −800 Oe~800 Oe, and the second magnetic field has an intensity in a range of −800 Oe~800 Oe. Concretely, apply a plurality of first magnetic fields in a range of −800 Oe~800 Oe in a first direction 291 that is perpendicular to the ABS 202, simultaneously apply 0 Oe in the second direction 292 to the magnetic head 210, and measure out a first output voltage curve C1. Particularly, three circles are performed in the present invention, thus three curves will be shown in a same graph for each testing.

Particularly, for the second output voltage curves, the sample of the first magnetic field is in a range of −800 Oe~800 Oe, and the samples of the second magnetic field are 0 Oe, 50 Oe, 100 Oe, 150 Oe, 200 Oe, −50 Oe, −100 Oe, −150 Oe and −200 Oe. Concretely, apply a plurality of first magnetic fields in a range of −800 Oe~800 Oe in a first direction 291 that is perpendicular to the ABS 202, and apply 50 Oe in the second direction 292 which is perpendicular to the first and second shielding layers 211, 212, and flows from the second shielding layer 212 to the first shielding layer 211 (that is the inflow direction), and measure a second output voltage curve C2. When apply the second magnetic field with negative, the second direction 292 is perpendicular to the first and second shielding layers 211, 212, and flows from the first shielding layer 211 to the second shielding layer 212 (that is the outflow direction). Repeat the magnetization operation and measurement operation until the above-mentioned data is applied, and finally measure out the output voltage parameter curves C3~C9.

In all of these graphs, the horizontal axis represents the magnetic field intensity, particularly represents the first magnetic field (expressed in Oe), and the vertical axis represents the output voltage (expressed in μV) from the tested magnetic head after magnetization has been carried out.

In the above graphs of output voltage curves C1~C9, it can be seen that, several great jumping appear on C6, C7, C8 and C9, which are under second magnetic fields of −50 Oe, −100 Oe, −150 Oe and −200 Oe respectively. Therein, the jumping ratio of the maximum jumping calculated is 14.8% in C6, which is larger than the allowable value of 8%. Thus, we can judge that the tested magnetic head is a problematic magnetic head which has a lot of noises if used in a high temperature condition.

FIGS. 7a-7i shows several testing curves for another tested magnetic head by using the method as described above. It can be seen that, a great jumping is presented on output voltage curves C7 and C8, which are under second magnetic fields of −100 Oe and −150 Oe respectively. Concretely, the jumping ratio of the maximum jumping calculated is 15.7% in C8. Thus, this tested magnetic head is also a problematic magnetic head that has a bad performance if used in a high temperature condition.

Inventors experiment a plurality of samples of magnetic heads to test by using the present testing method, and find out the testing precise of the testing method is considerable, which is higher than 75%. Only two representative samples are shown in the above embodiments for concision.

In comparison with the prior art, the present invention applies a second magnetic field in a second direction that is perpendicular to the shielding layers of the magnetic field and measures out the output of the magnetic head, and repeats the magnetization operation and the measurement operation for several times, and finally screens out the defective magnetic head along the several output curves. The present invention test out the defective magnetic heads that have a lot of noises under a high temperature condition in a room temperature, without applying additional heat to the magnetic head. Thus the testing method is improved compared with the prior art. Moreover, the present invention can screen out defective magnetic heads that could not be completely detected by a conventional testing method that uses common magnetization, and the testing precision is reliable.

Please notice that the first direction, namely the transverse direction used in the above embodiments goes in the ABS, but it's not limited here. Another first direction that goes out from the ABS also can be used within the conception of the present invention.

Figure 8:
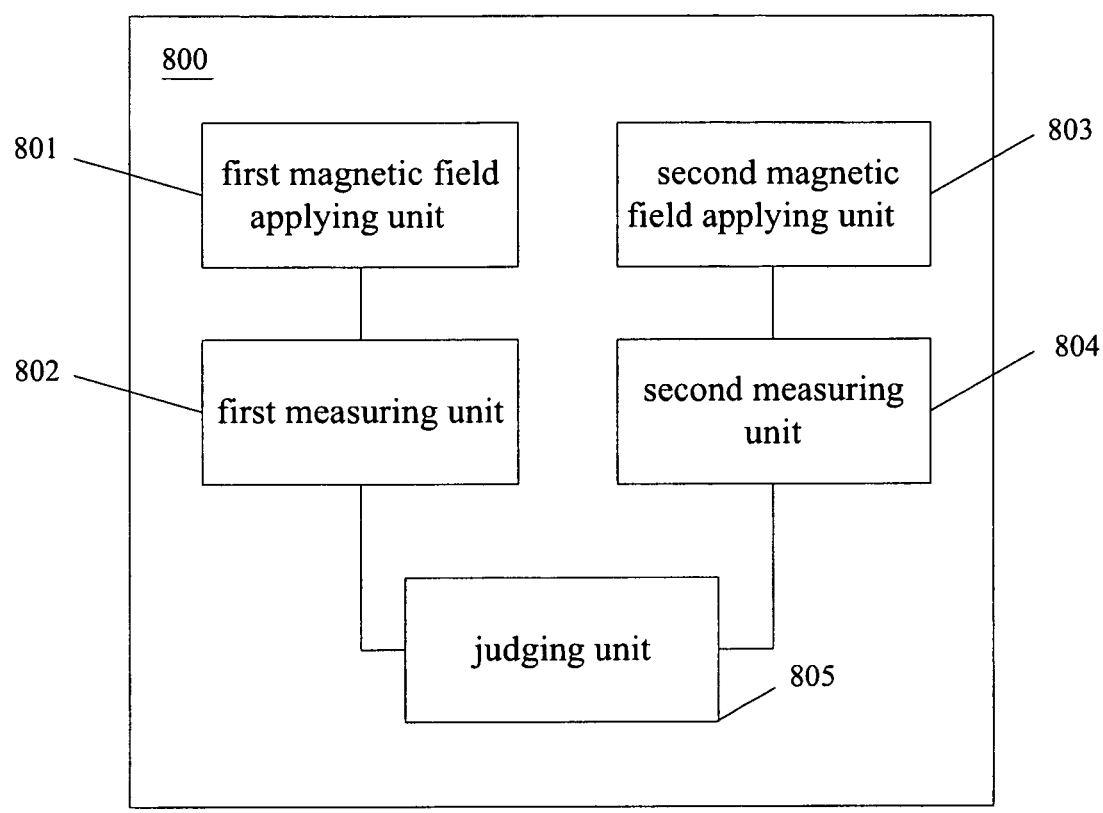
FIG. 8 shows an apparatus for testing anti-high temperature performance of a magnetic head according to one embodiment of the present invention.

FIG. 8 shows an apparatus for testing anti-high temperature performance of a magnetic head according to one embodiment of the present invention. As shown, the apparatus 800 includes a first magnetic field applying unit 801 for applying a plurality of first magnetic fields with different intensities in a first direction to the magnetic head, a first measuring unit 802 for measuring a first output parameter curve according to the first magnetic fields, a second magnetic field applying unit 803 for repeating to apply a second magnetic field with different intensities in a second direction and the changing first magnetic fields in the first direction, a second measuring unit 804 for measuring a plurality of second output parameters, and a judging unit 805 for judging whether the variation of the second output parameter curve and the first output parameter curve is beyond an allowable value, thereby screening out the defective magnetic head. Therein, the first direction is perpendicular to the ABS of the magnetic head, and the second direction is perpendicular to the shielding layers of the magnetic head.

Concretely, the apparatus 800 further comprises a third magnetic field applying unit (not shown) for applying a third magnetic field with a third direction to the magnetic head, and the third direction is parallel to the shielding layers and at 0° angle to the ABS.

The apparatus 800 performs the testing by using the testing method described above, the defective magnetic head having bad performance if in a high temperature condition can be screened out with high precision. The apparatus 800 can obtain all advantages described in the embodiments of the testing method.

Figure 9:
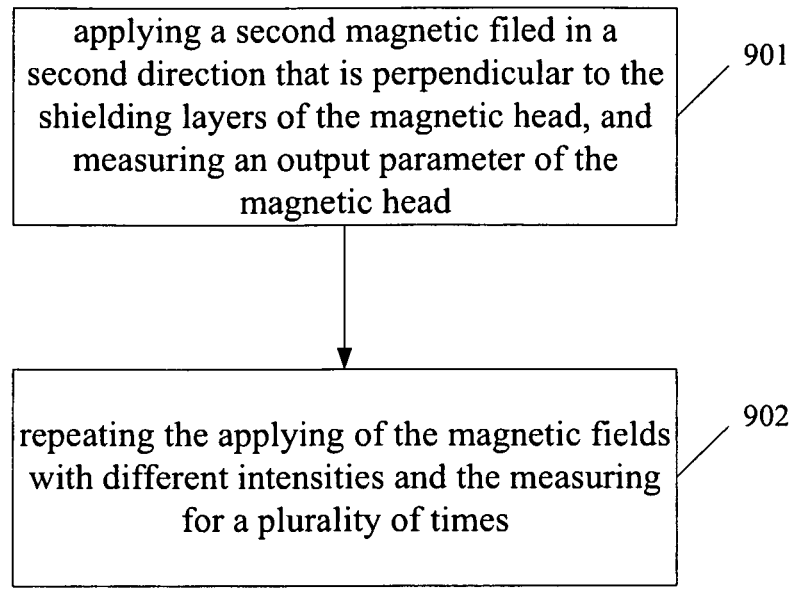
FIG. 9 is a flowchart of a method of testing the performance of a magnetic head according to one embodiment of the present invention.

Within the contemplation of the present invention, a magnetic field in the second direction that is perpendicular to the shielding layers of the magnetic head can be applied in kinds of Quasi-Static Test (QST) for the magnetic head. FIG. 9 shows a flowchart of a method of testing performance of a magnetic head according to one embodiment of the present invention, which includes the follow steps at least.

Step (901), applying a second magnetic filed in a second direction that is perpendicular to the shielding layers of the magnetic head, and measuring an output parameter of the magnetic head; and Step (902), repeating the applying of the magnetic fields with different intensities and the measuring for a plurality of times.

If necessary, a first magnetic field in a first direction that is perpendicular to the air bearing surface to the magnetic head can be applied during the QST, and a third magnetic field in a third direction to the magnetic head, and the third direction is parallel to the shielding layers and at 0° angle to the ABS.

Particularly, as described above, the first direction is a transverse direction that includes the cases of going in the ABS and going out from the ABS, the second direction includes an outflow direction and an inflow direction, which can be utilized according to the actual testing. Concretely, the first and the second output parameter can be represented by output voltage, resistance or SNR.

Figure 10:
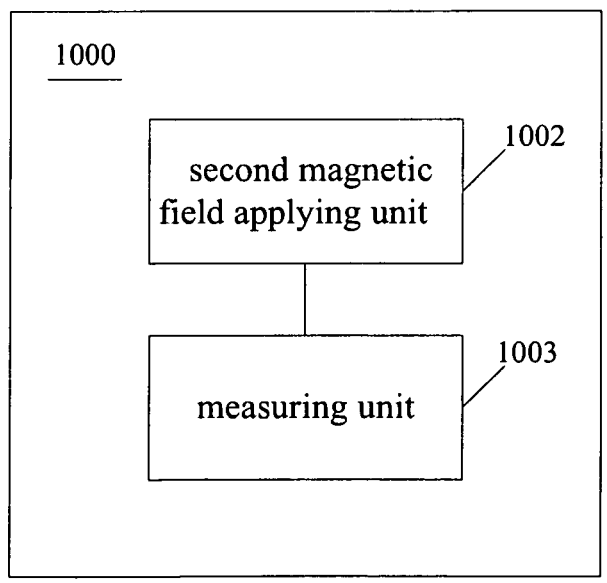
FIG. 10 shows an apparatus for testing the performance of a magnetic head according to one embodiment of the present invention.

Accordingly, FIG. 10 shows an apparatus for testing the performance of a magnetic head according to one embodiment of the present invention. As shown, the apparatus 1000 includes a second magnetic field applying unit 1002 for repeating to apply a second magnetic filed with different intensities in a second direction that is perpendicular to the shielding layers of the magnetic head, and a measuring unit 1003 for measuring output parameters of the magnetic head according to the second magnetic fields, so as to test the performance of the magnetic head.

Concretely, the apparatus 1000 further comprises a first magnetic filed applying unit (not shown) for applying a first magnetic field in a first direction that is perpendicular to the air bearing surface to the magnetic head.

Preferably, the apparatus 1000 further comprises a third magnetic field applying unit (not shown) for applying a third magnetic field with a third direction to the magnetic head, and the third direction is parallel to the shielding layers and at 0° angle to the ABS.

The apparatus 1000 performs the testing by using the testing method described above, the defective magnetic head having bad performance can be screened out with high precision. If necessary, the apparatus 1000 can include all of the function units according to the testing method, which is omitted herein.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A method of testing anti-high temperature performance of a read head of a magnetic head, the read head including two shielding layers and an air bearing surface, the shielding layers being placed perpendicularly to the air bearing surface, and the method comprising:
    applying a plurality of first magnetic fields with different intensities in a first direction to the magnetic head, and measuring a first output parameter curve;
    repeating to apply a second magnetic field with different intensities in a second direction and applying the first magnetic fields in the first direction synchronously, and measuring a plurality of second output parameter curves; and
    judging whether a variation that is beyond an allowable value is presented on the first output parameter curve and the second output parameter curves, thereby screening out a defective magnetic head,
    wherein the first direction is perpendicular to the air bearing surface of the magnetic head, and the second direction is perpendicular to the shielding layers of the magnetic head, in the testing of the anti-high temperature performance of the read head that includes the two shielding layers and the air bearing surface.

2. The method according to claim 1, wherein the method further comprises applying a third magnetic field with a third direction to the magnetic head, and the third direction is parallel to the shielding layers and at 0° angle to the air bearing surface.

3. The method according to claim 1, wherein the first direction goes in the air bearing surface or goes out from the air bearing surface.

4. The method according to claim 1, wherein the shielding layers comprise a first shielding layer and a second shielding layer, the second direction flows from the first shielding layer to the second shielding layer, or flows from the second shielding layer to the first shielding layer.

5. The method according to claim 1, wherein the intensity of the first magnetic field and the second magnetic field is in a range of −800 Oe~800 Oe.

6. The method according to claim 1, wherein the intensity of the second magnetic fields includes several pairs of numerical values that have the same absolute value.

7. The method according to claim 1, wherein the first and the second output parameter curves are represented by output voltage.

8. The method according to claim 1, wherein the first and the second output parameter curves are represented by signal-to-noise ratio.

9. The method according to claim 1, wherein the variation has a maximum jumping having a jumping ratio, and the jumping ratio of the allowable value is 8%.

10. A method of testing the performance of a read head of a magnetic head, the read head including two shielding layers and an air bearing surface, the shielding layers being placed perpendicularly to the air bearing surface, and the method comprising:
    applying a second magnetic filed in a second direction that is perpendicular to the shielding layers to the magnetic head, and measuring an output parameter of the magnetic head; and
    repeating the applying of the second magnetic fields with different intensities and the measuring for a plurality of times, so as to test the performance of the magnetic head, in the testing of the anti-high temperature performance of the read head that includes the two shielding layers and the air bearing surface.

11. The method according to claim 10, wherein the method further comprises applying a first magnetic field in a first direction that is perpendicular to the air bearing surface to the magnetic head.

12. The method according to claim 10, wherein the method further comprises applying a third magnetic field in a third direction to the magnetic head, and the third direction is parallel to the shielding layers and at 0° angle to the air bearing surface.

13. The method according to claim 11, wherein the first direction goes in the air bearing surface or goes out from the air bearing surface.

14. The method according to claim 10, wherein the shielding layers comprise a first shielding layer and a second shielding layer, the second direction flows from the first shielding layer to the second shielding layer, or flows from the second shielding layer to the first shielding layer.

15. The method according to claim 11, wherein the first and the second output parameter is represented by output voltage.

16. The method according to claim 11, wherein the first and the second output parameter is represented by signal-to-noise ratio.

17. An apparatus for testing anti-high temperature performance of a read head of a magnetic head, the read head including two shielding layers and an air bearing surface, the shielding layers being placed perpendicularly to the air bearing surface, and the apparatus comprising:
    a first magnetic field applying unit for applying a plurality of first magnetic fields with different intensities in a first direction to the magnetic head;
    a first measuring unit for measuring a first output parameter curve according to the first magnetic fields;
    a second magnetic field applying unit for repeating to apply a second magnetic field with different intensities in a second direction and applying the first magnetic fields in the first direction to the magnetic head synchronously;
    a second measuring unit for measuring a plurality of second output parameters; and
    a judging unit for judging whether a variation that is beyond an allowable value is presented on the first output parameter curve and the second output parameter curves, thereby screening out a defective magnetic head;

wherein the first direction is perpendicular to the air bearing surface of the magnetic head, and the second direction is perpendicular to the shielding layers of the magnetic head, in the testing of the anti-high temperature performance of the read head that includes the two shielding layers and the air bearing surface.

18. The apparatus according to claim 17, wherein the apparatus further comprises a third magnetic field applying unit for applying a third magnetic field with a third direction to the magnetic head, and the third direction is parallel to the shielding layers and at 0° angle to the air bearing surface.

19. The apparatus according to claim 17, wherein the first direction goes in the air bearing surface or goes out from the air bearing surface.

20. The apparatus according to claim 17, wherein the shielding layers comprise a first shielding layer and a second shielding layer, the second direction flows from the first shielding layer to the second shielding layer, or flows from the second shielding layer to the first shielding layer.

21. The apparatus according to claim 17, wherein the intensity of the first magnetic field and the second magnetic field is in a range of −800 Oe~800 Oe.

22. The apparatus according to claim 17, wherein the intensity of the second magnetic fields includes several pairs of numerical values that have the same absolute value.

23. The apparatus according to claim 17, wherein the first and the second output parameter curves are represented by output voltage.

24. The apparatus according to claim 17, wherein the first and the second output parameter curves are represented by signal-to-noise ratio.

25. The apparatus according to claim 17, wherein the variation has a maximum jumping that has a jumping ratio, and the jumping ratio of the allowable value is 8%.

26. An apparatus for testing the performance of a read head of a magnetic head, the read head including two shielding layers and an air bearing surface, the shielding layers being placed perpendicularly to the air bearing surface, and the apparatus comprising:
 a second magnetic field applying unit for repeating to apply a second magnetic filed with different intensities in a second direction that is perpendicular to the shielding layers of the magnetic head; and
 a measuring unit for measuring output parameters of the magnetic head according to the second magnetic fields, so as to test the performance of the magnetic head, in the testing of the anti-high temperature performance of the read head that includes the two shielding layers and the air bearing surface.

27. The apparatus according to claim 26, wherein the apparatus further comprises a first magnetic filed applying unit for applying a first magnetic field in a first direction that is perpendicular to the air bearing surface.

28. The apparatus according to claim 26, wherein the apparatus further comprises a third magnetic field applying unit for applying a third magnetic field with a third direction to the magnetic head, and the third direction is parallel to the shielding layers and at 0° angle to the air bearing surface.

29. The apparatus according to claim 27, wherein the first direction goes in the air bearing surface or goes out from the air bearing surface.

30. The apparatus according to claim 26, wherein the shielding layers comprise a first shielding layer and a second shielding layer, the second direction flows from the first shielding layer to the second shielding layer, or flows from the second shielding layer to the first shielding layer.

31. The apparatus according to claim 27, wherein the first and the second output parameters are represented by output voltage.

32. The apparatus according to claim 27, wherein the first and the second output parameters are represented by signal-to-noise ratio.

* * * * *